United States Patent
Kropp

(10) Patent No.: US 6,897,485 B2
(45) Date of Patent: May 24, 2005

(54) DEVICE FOR OPTICAL AND/OR ELECTRICAL DATA TRANSMISSION AND/OR PROCESSING

(75) Inventor: Jörg-Reinhardt Kropp, Berlin (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/462,956

(22) Filed: Jun. 17, 2003

(65) Prior Publication Data

US 2003/0231842 A1 Dec. 18, 2003

(30) Foreign Application Priority Data

Jun. 17, 2002 (DE) .......................... 102 27 544

(51) Int. Cl.$^7$ ............................... H01L 29/26
(52) U.S. Cl. ..................... 257/80; 257/82; 385/14; 385/15
(58) Field of Search .................. 257/80, 82, 83, 257/257, 114, 116, 53, 290, 431, 444; 385/14, 15, 88, 92

(56) References Cited

U.S. PATENT DOCUMENTS

| | | | |
|---|---|---|---|
| 4,410,469 A | * 10/1983 | Katagiri et al. ............. 264/1.25 |
| 6,100,804 A | * 8/2000 | Brady et al. ............. 340/572.7 |
| 6,243,508 B1 | * 6/2001 | Jewell et al. .................. 385/14 |
| 6,320,178 B1 | 11/2001 | Miller et al. |
| 6,550,982 B2 | 4/2003 | Auburger et al. |
| 2001/0022401 A1 | 9/2001 | Nakamura |
| 2003/0031428 A1 | * 2/2003 | Wickman et al. ............. 385/89 |

FOREIGN PATENT DOCUMENTS

| | | |
|---|---|---|
| DE | 198 12 008 A1 | 9/1999 |
| DE | 100 34 865 A1 | 2/2002 |
| WO | 01/01497 A1 | 1/2001 |

* cited by examiner

Primary Examiner—Eddie Lee
Assistant Examiner—Douglas W. Owens
(74) Attorney, Agent, or Firm—Laurence A. Greenberg; Werner H. Stemer; Ralph E. Locher

(57) ABSTRACT

A device for optical and/or electrical data transmission and/or processing has at least one electrical component, at least one optoelectronic component electrically connected to the electrical component, and an optically transparent carrier with a first surface, on which the electrical component and the optoelectronic component are disposed. Light is coupled into or out of the optoelectronic component through the carrier, and a frame is connected to the carrier, via which frame the components disposed on the carrier are electrically contact-connected. The device provides both optical and electrical inputs and outputs for optoelectronic and electrical components integrated into a device.

31 Claims, 3 Drawing Sheets

DEVICE FOR OPTICAL AND/OR ELECTRICAL DATA TRANSMISSION AND/OR PROCESSING

BACKGROUND OF THE INVENTION

Field of the Invention

The invention relates to a device for optical and/or electrical data transmission and/or processing. It relates, in particular, to devices having electrical and optoelectronic components that interact for the transmission and/or processing of data.

Configurations are known in which optical and electrical components are mounted in each case in separately encapsulated fashion on a carrier, formed either as a metallic heat sink or as a printed circuit board. The optical paths are coupled out of the housing by separate optical elements or windows disposed above the electro-optical transducers.

SUMMARY OF THE INVENTION

It is accordingly an object of the invention to provide a device for optical and/or electrical data transmission and/or processing that overcomes the above-mentioned disadvantages of the prior art devices of this general type, which enables an increased degree of integration of electrical and optoelectronic components in a housing configuration.

With the foregoing and other objects in view there is provided, in accordance with the invention, a device for optical data transmission, electrical data transmission and/or data processing. The device contains at least one electrical component, at least one optoelectronic component electrically connected to the electrical component, and an optically transparent carrier having a first surface supporting the electrical component and the optoelectronic component and a second surface. Light is coupled into and out of the optoelectronic component through the optically transparent carrier. A frame is connected to the optically transparent carrier, and through the frame the electrical component and the optoelectronic component are electrically contact-connected.

Accordingly, the solution according to the invention is distinguished by the fact that at least one electrical component and at least one optoelectronic component connected to the electrical component are disposed on the same surface of an optically transparent carrier. In this case, light is coupled into or out of the optoelectronic component through the carrier, i.e. the optical inputs and/or outputs of the device lie on that side of the carrier that is opposite to the side provided with the optical components. Furthermore, the invention provides a frame connected to the carrier, via which frame the components disposed on the carrier are electrically contact-connected.

The device described represents a compact and encapsulatable configuration for optoelectronic and electrical components disposed together on a carrier. It is suitable in particular for novel assemblies with electrical and optical signal paths that can be disposed in a space-saving and cost-effective manner.

In this case, in addition to its function as a carrying element for the components, the optically transparent carrier also fulfills a protection and sealing function for the entire package, since it provides a large-area termination of the device. At the same time, the optically transparent carrier provides a window function, so that light can be coupled in and out through the carrier.

The electrical inputs and outputs are provided by corresponding contacts of the frame. The device thus provides both optical and electrical inputs and outputs for jointly disposed optoelectronic and electrical components.

Optoelectronic components are understood to be those components that emit, convert, transmit and/or modulate electromagnetic radiation. Electrical components are understood to be arbitrary electrical components apart from those of optoelectronics.

In a preferred refinement of the invention, first contact regions of the carrier are provided for the contact connection of the components disposed on the carrier, via which contact regions the components are electrically connected to the carrier. What are involved are, in particular, so-called contact pads that are formed on the topside of the carrier and are placed onto the corresponding contacts of the components.

Furthermore, the optically transparent carrier preferably has second contact regions, which are electrically connected to the first contact regions of the carrier, in particular by conductor tracks realized on the surface of the carrier. The second contact regions of the carrier are assigned third contact regions of the frame, which are in electrical contact with the second contact regions of the carrier. Furthermore, electrical conductor tracks are provided on or in the frame, which conductor tracks are connected to the third contact regions, on the one hand, and to fourth electrical contact regions of the frame, on the other hand, the latter serving for the external electrical contact connection of the device and containing metallic bumps, for example, via which the device is connected and contact-connected to a printed circuit board.

The components disposed on the optically transparent carrier are thus electrically contact-connected by electrical conductor tracks on the frame and on the carrier. An electrical connection is therefore provided, on the one hand, between the frame and the carrier and, on the other hand, between the carrier and components disposed thereon in each case via contact regions formed at the ends of the conductor tracks.

In principle, however, it is also conceivable for the components disposed on the carrier not to be contact-connected through the conductor tracks formed on the surface of the carrier, but rather, for example, by bonding wires directly from corresponding contact regions of the frame to the components.

The optoelectronic or electrical components are preferably mounted on the optically transparent carrier by flip-chip mounting. However, other contact-connection techniques are likewise possible, for instance bonding connections between the components and associated contact regions on the carrier.

It is pointed out that, on account of the realization of the data inputs and outputs as optical inputs and outputs through the optically transparent carrier, the connections or conductor tracks serving for the electrical contact connection of the components in the frame and on the surface of the carrier do not have to satisfy radiofrequency requirements. They serve only for the electrical supply of the components and, if appropriate, the transmission of control signals. These simplified requirements made of the electrical connections mean that the device can be produced relatively cost-effectively.

In one preferred refinement of the invention, a common optically transparent potting is situated at least in the regions between the first surface of the carrier and the underside of the optical components, which potting both serves for encapsulating the components and protects and secures the optical signal path to the optical components. For protection against environmental influences, the components can also be completely encapsulated by a corresponding transparent potting.

In a further preferred refinement, the frame projects laterally beyond the optically transparent carrier. This makes it possible to provide an electrical contact connection of the frame in regions located laterally with respect to the optically transparent carrier, so that these contact connections do not disturb the optical window provided by the carrier.

In one preferred refinement of the invention, the frame is a ceramic part with metallic conductor tracks. For the external electrical contact connection, metallic bumps may be mounted on the frame, which bumps project above the mounted optical carrier. In this way, both the electrical and the optical contact connection or coupling of the device can be affected from the underside.

A further advantageous refinement of the invention provides for the frame to be stepped such that that surface which is opposite to the first surface of the carrier lies essentially in the same plane as the corresponding side of the frame or in a manner offset forward or backward somewhat with respect thereto. In this case, e.g. the electrical conductor tracks may be integrated into the stepped frame. One example of such a refinement of a frame is a plastic frame with metal contacts encapsulated by injection molding.

In a further refinement, the frame contains a leadframe onto which is mounted the optical carrier with the electrical and optoelectronic components. After mounting, the leadframe together with the optical carrier and the components is preferably encapsulated with a plastic compound in such a way that only the underside of the optical carrier with the optical inputs and/or outputs is uncovered.

A further advantageous refinement provides for the optically transparent carrier to have markings that serve for orienting the carrier during mounting. The markings may be, for example, metallic structures that are applied on the topside of the carrier, for example, so that they are visible through the optically transparent carrier. The structures can be used both for the mounting of the optical components and for the mounting of the finished mounted device. As an alternative, the markings are provided by mechanical latching structures that are preferably formed on the carrier underside, i.e. the surface opposite to the surface provided with the components. The mechanical latching structures may also be formed at the edges of the carrier. The use of mechanical latching structures also enables, in particular, a passive orientation of the carrier or of the finished mounted device during the mounting of the carrier or of the housing.

Preferably, optical functional elements are disposed on the optical carrier or integrated into the latter. The optical functional elements, which are lenses or mirrors, for example, effect light shaping or light deflection of the radiation of the optical inputs or outputs of the device.

A further preferred exemplary embodiment provides for a metallic covering to be disposed on the topside of the housing, i.e. that side of the carrier that is provided with the components. The covering may be formed in peripheral fashion and be connected to the frame. In a preferred refinement of this variant of the invention, the metal covering is mechanically coupled to one or more of the components, in particular by a thermally conductive paste or a thermally conductive adhesive, so that the metallic covering serves as a heat sink and for dissipating the power loss of the components. It may also be provided that the metallic covering is electrically connected to at least one electrical contact of the device in order to achieve an electrical shielding effect.

The device according to the invention preferably has at least two optoelectronic components, of which at least one realizes a data input of the device and at least one realizes a data output of the device. In this case, the optoelectronic components are preferably assigned at least one integrated circuit for which the optoelectronic components provide the data input and data output. Consequently, an optical data input is present, a conversion of the optical data into electrical data ensues in the first optoelectronic component, the electrical data are processed in the electrical component, and the processed or new data are electrically output by the electrical component, subsequently converted into optical data in the second optoelectronic component and output optically. In this case, depending on the number of incoming and outgoing data channels, it is also possible for a plurality of optoelectronic components to serve as data input or output.

The configuration of the components on the carrier is preferably symmetrical. In particular, an optoelectronic transducer is respectively disposed on this side of the integrated circuit.

The optoelectronic components preferably each have an array of optoelectronic transducers, so that, by each optoelectronic component, a multiplicity of optical input signals are converted into electrical input signals for the integrated circuit and a multiplicity of electrical output signals of the integrated circuit are converted into optical signal outputs.

The transmission and processing of data can be effected with a higher transmission rate in the case of such an expansion in comparison with purely electrical signal transmission. The optoelectronic transducers carry out a conversion of optical into electrical data streams and vice-versa and function as an input interface and an output interface, respectively, of an electrical component. On account of the data being introduced and forwarded optically, the requirements made of the radio frequency suitability of the device can be significantly reduced.

The present invention is suitable for all electrical components that transmit and/or process data. The electrical components are, for example, microprocessors with an arithmetic logic unit, memory chips or else switch devices. In the latter case, the electrical component contains a switching matrix that uses headers of the incoming data streams and signaling commands to determine how the incoming data are distributed between the data outputs. Such a switch is used in a manner known per se in particular in telecommunications networks.

Other features which are considered as characteristic for the invention are set forth in the appended claims.

Although the invention is illustrated and described herein as embodied in a device for optical and/or electrical data transmission and/or processing, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
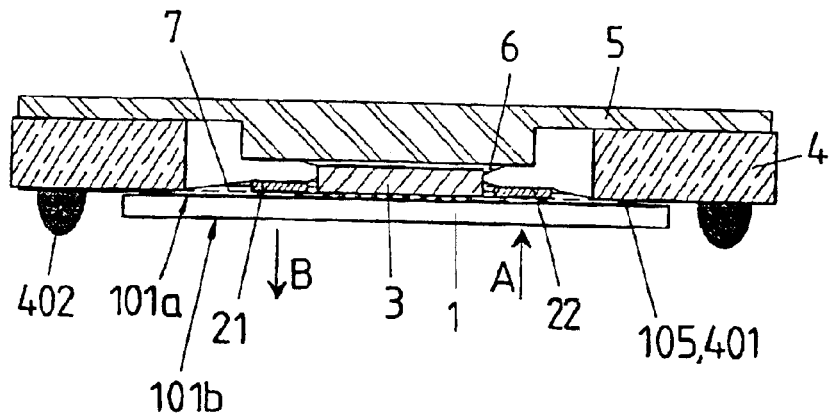
FIG. 1 is a diagrammatic, sectional view through a first exemplary embodiment of a device having optoelectronic and electrical components.

Referring now to the figures of the drawing in detail and first, particularly, to FIG. 1 thereof, there is shown a device that has as essential elements an optically transparent carrier 1, two optoelectronic components 21, 22, an electrical component 3, a frame 4 and a metallic cover 5. The device is distinguished by a new configuration of these intrinsically known elements.

The optically transparent carrier 1 contains a material that is transparent to light wavelengths used, for example made of glass, silicon or else plastic. The optoelectronic components 21, 22 and the electrical component 3 are disposed on the same, inner surface 101a of the carrier 1. Light is coupled into and out of the optoelectronic components 21, 22 through the carrier 1 and thus through an outer surface 101b, which is parallel to the inner surface 101a. By way of example, optical input signals are coupled into the optoelectronic component 22 in direction A through the carrier 1 and are coupled out of the optoelectronic component 21 in direction B in each case perpendicular to the surface of the carrier 1.

Figure 2:
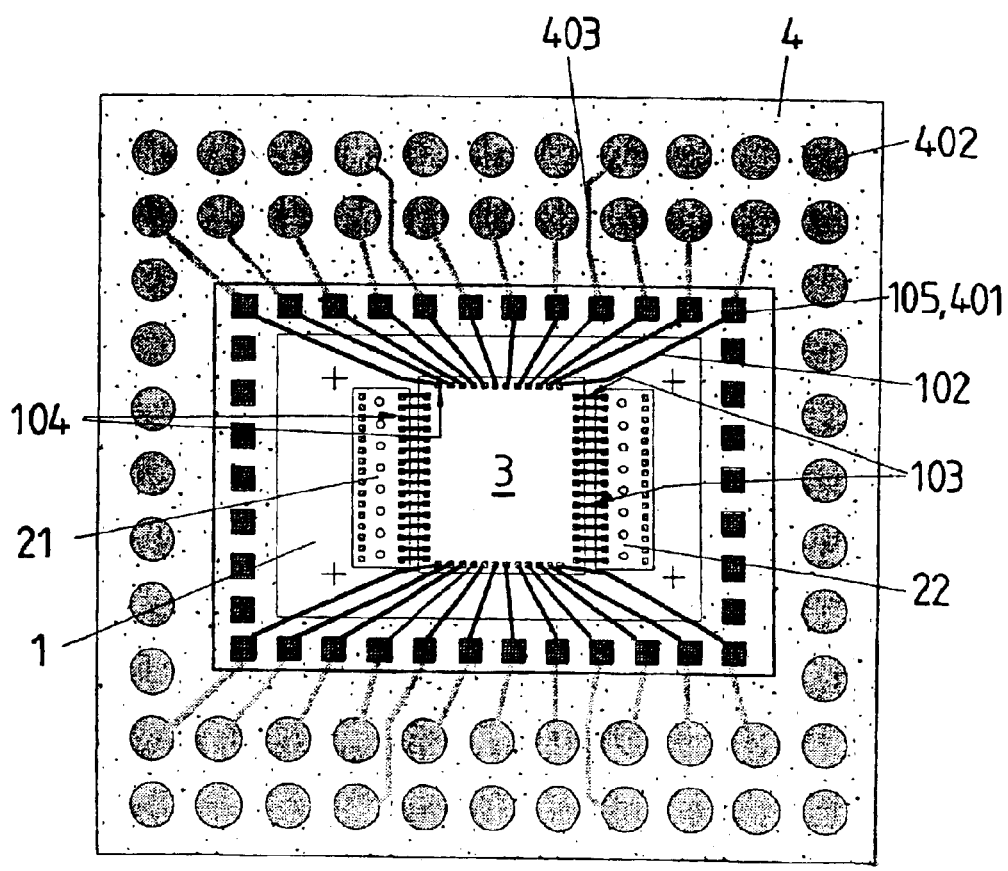
FIG. 2 is a bottom plan view of the device.

As can be seen in FIG. 2, the optoelectronic components 21, 22 are formed as an array of optoelectronic transducers, so that they convert a multiplicity of optical input signals into electrical signals and a multiplicity of electrical signals into optical output signals.

The electrical component 3 is, by way of example, a microprocessor, a memory chip or a switch with an integrated switching matrix that is used in telecommunications. Generally, it is possible to use any desired electrical module that processes incoming data and outputs the processed and/or new data.

Input data present in optically modulated form are converted by the optoelectronic component 22 into electrically modulated data for the electrical component 3 and the output data of the electrical component 3 are converted into optically modulated signals again by the optoelectronic transducer 21, so that the data input and output of the device are effected in a completely optical fashion. In this case, the incoming and outgoing data may be both data of a program or of a file and signaling or control data that control the internal sequence of the electrical component. In this case, in an alternative configuration, provision may be made, for example, for providing further optoelectronic components specifically for the control data.

As can be gathered from FIG. 2, in particular, a multiplicity of conductor tracks 102, 103 are situated on the surface 101 of the optically transparent carrier 1. Some of the conductor tracks 102 connect first electrical contact regions 104 of the carrier 1 to second electrical contact regions 105 of the carrier, and others of the conductor tracks 103 interconnect the first electrical contact regions 104. The first optical contact regions 104 are contact pads that serve for the contact connection and electrical connection of the optoelectronic components 21, 22 and of the electrical component 3 to the carrier 1. In this case, the components 3, 21, 22 are mounted on the carrier 1 by flip-chip mounting, so that there is no need for any bonding connections between the contacts of the components 3, 21, 22 and the contact pads 104, rather the bottom contacts (not illustrated separately) of the components 3, 21, 22 are directly in contact with the associated contact pads 104 of the carrier.

The second electrical contact regions 105 are likewise formed as contact pads 105. They are in contact with assigned third contact regions or contact pads 401 of the frame 4 carrying the carrier 1 with the components 3, 21, 22. The frame 4 in turn contains, in addition to the third optical contact regions 401 mentioned, fourth optical contact regions 402, which, in the exemplary embodiment illustrated, are formed as metallic bumps and are connected to the third electrical contact regions 401 via diagrammatically illustrated conductor tracks 403 integrated into the frame 4.

The frame 4 projects laterally relative to the carrier 1, so that the frame 4 can be contact-connected and connected to a printed circuit board toward the bottom via the fourth electrical contact regions 402. The components 3, 21, 22 are electrically supplied and connected up via the printed circuit board, the electrical contact regions 402, the electrical conductor tracks 403, the electrical contact regions 401 of the frame 4 and 105 of the carrier 1 that are in contact, the conductor tracks 102, 103 and also the first contact regions 104 of the carrier 1.

It is pointed out that, in the exemplary embodiment illustrated in FIG. 2, an electrical supply or power supply of the optoelectrical transducers 21, 22 is effected via the electrical component 3. Equally, it may be provided that the optoelectronic components 21, 22 are directly connected to assigned second contact pads 105 of the carrier 1 via corresponding electrical connections.

It is equally pointed out that, in alternative configurations, it is also possible to dispense with separate conductor tracks 102, 103 on the carrier 1. The components 3, 21, 22 are then contact-connected directly from the frame 4 by bonding wires.

As can be gathered from the sectional view of FIG. 1, an optically transparent potting 7 runs between the inner surface 101a of the carrier 1 and the underside of the components 21, 22, 3. The potting 7 serves, on the one hand, for encapsulating the components and, on the other hand, for protecting the optical signal path between the carrier 1 and the optoelectronic components 21, 22 against dust and environmental influences.

A thermal contact is produced between the metallic cover 5 and the electrical component 3 by a paste or an adhesive 6 with good thermal conductivity, so that the metallic cover 5 serves as a heat sink for the electrical component 3.

In the embodiment illustrated in FIGS. 1 and 2, the frame 4 contains a ceramic part to which the metallic conductor tracks 403 are applied.

Figure 3:
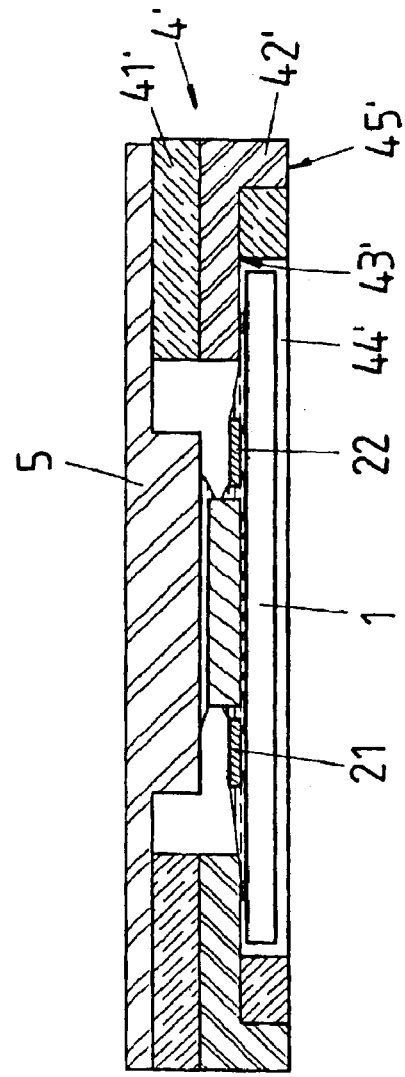
FIG. 3 is a sectional view through a second exemplary embodiment of the device having the optoelectronic and electrical components, in which a frame of the device is formed by a plastic frame with metal contacts.

FIG. 3 illustrates an exemplary embodiment which differs from the previous exemplary embodiment insofar as a frame 4' contains a plastic frame 41' with metal contacts 42' encapsulated by the plastic frame 41'. While the plastic frame 41' fulfills the carrying function, the metal contacts 42', formed by a leadframe, for example, serve for the electrical supply of the carrier 1 or the components 21, 22, 3 disposed on the carrier 1.

The frame 4' has a step 43', so that the carrier 1 to a certain extent lies in a cutout 44' of the frame 4' and the outwardly directed surface 101b of the carrier 1 terminates flush with a lower area 45' of the frame 4' or stands back somewhat with respect to the area.

Figure 4:
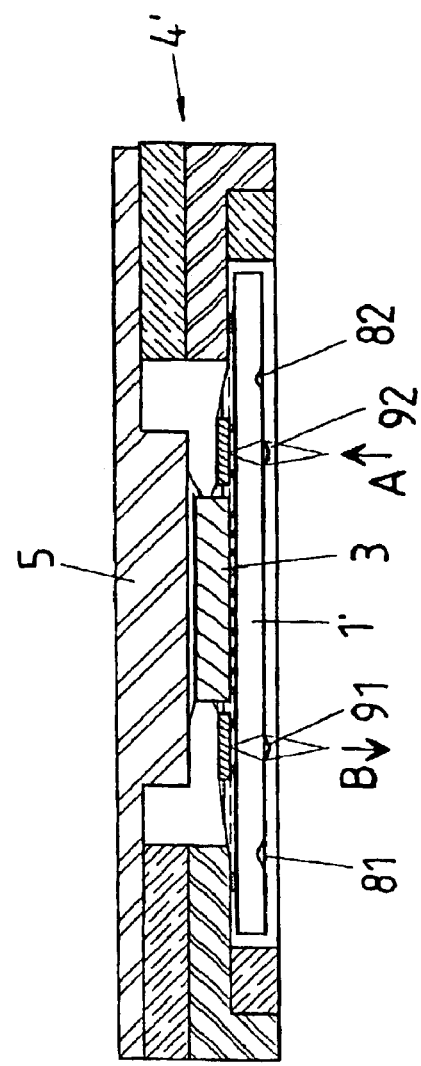
FIG. 4 is a sectional view through a third exemplary embodiment of the device having the optoelectronic and electrical components in accordance with the exemplary embodiment of FIG. 3, mechanical latching structures and optical functional elements being integrated into the carrier.

In the exemplary embodiment of FIG. 4, beam-shaping lenses 91, 92 and mechanical latching structures 81, 82 are introduced into the carrier 1'. The lenses 91, 92 serve for improved coupling in and out of light and the mechanical latching structures 81, 82 serve as a positioning aid during the positioning both of the carrier 1' with respect to the frame 4 and of the device overall for example with respect to other devices or a printed circuit board. The latching structures 81, 82 may also serve for passive alignment.

Figure 5:
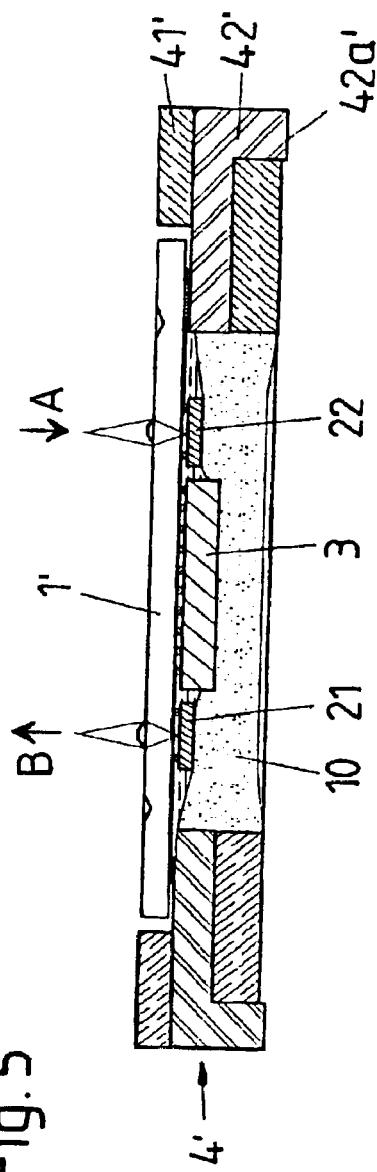
FIG. 5 is a sectional view through a fourth exemplary embodiment of the device having the optoelectronic and electrical components, light being coupled in and out from and toward the top and, instead of a cover, a potting with a light-opaque potting compound being provided.

The exemplary embodiment illustrated in FIG. 5 manages without a cover. Instead, the region adjoining the components 21, 22, 3 disposed on the carrier 1 is encapsulated with a second potting material 10, preferably a nontransparent potting material. This variant is suitable in particular when using electrical components 3 which have only little evolution of heat and, accordingly, do not need intensive heat dissipation by a cover.

A further difference between the exemplary embodiment of FIG. 5 and the previous exemplary embodiment is that the carrier 1' lies at the top and light is coupled in and out toward the top, i.e. the optical inputs and outputs lie at the top. The frame 4' is again formed as a plastic frame 41' with metal contacts 42', the electrical inputs and outputs 42a' furthermore lying at the bottom. This embodiment variant is suitable in particular for placement on a printed circuit board.

Figure 6:
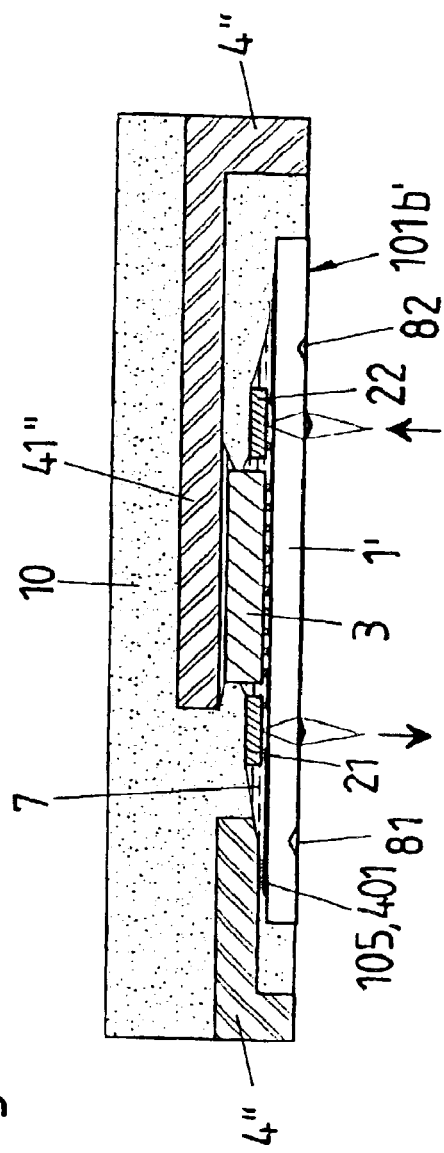
FIG. 6 is a sectional view through a fifth exemplary embodiment of the device having the optoelectronic and electrical components, the frame being formed as a lead-frame and the device being encapsulated with a light-opaque potting compound.

Finally, in the exemplary embodiment of FIG. 6, the carrier is completely formed by a leadframe 4". In this case, a projecting arm 41" of the leadframe serves as cover/ covering or heat sink for the electrical component 3. The configuration is potted in the nontransparent potting material 10 in order to form an encapsulated package. In this case, in the region of the components 3, 21, 22, the nontransparent potting material 10 adjoins the transparent potting 7 between the carrier 1' and at least the underside of the components 3, 21, 22. The transparent potting is naturally provided before the nontransparent potting 10.

In the exemplary embodiment of FIG. 6, it is provided that an outer surface 101b' of the carrier 1' projects outward somewhat with respect to the frame 4". What is thereby achieved is that, for the purpose of passive alignment, a mechanical contact with the latching structures 81, 82 can be produced during mounting.

In modifications of the exemplary embodiments of FIGS. 1 to 6, only one optoelectronic component is provided, which is connected to the electrical component. In this case, the optoelectronic component represents a data input or a data output of the device. When the optoelectronic component is formed as a data input, an optical input signal of a communication channel, which signal is modulated in accordance with data to be transmitted, is converted into an electrical input signal by the optoelectronic component and passed to the at least one electrical component. When the optoelectronic component is formed as a data output, an electrical output signal that is received from the electrical component and modulated in accordance with data to be transmitted is correspondingly converted into an optical output signal and emitted through the carrier.

In this case, a multiplicity of communication channels are preferably provided, the optoelectronic component having a multiplicity of optoelectronic transducers. The multiplicity of optoelectronic transducers is preferably formed as an array.

In further modifications of the exemplary embodiments of FIGS. 1 to 6, both optoelectronic components of FIGS. 1 to 6 represent a data input or both optoelectronic components of FIGS. 1 to 6 represent a data output.

I claim:

1. A device for at least one of optical data transmission, electrical data transmission and data processing, comprising:
    at least one electronic component for processing electronic data;
    at least one optoelectronic component electrically connected to said electronic component;
    an optically transparent carrier having a first surface supporting said electronic component and said optoelectronic component and a second surface, light being coupled into and out of said optoelectronic component through said optically transparent carrier;
    a frame connected to said optically transparent carrier, and through said frame said electronic component and said optoelectronic component being electrically contact-connected; and
    a plurality of electrical conductor tracks connecting said optoelectronic component to said electronic component, said electrical conductor tracks being disposed either directly between said electronic component and said optoelectronic component or on said optically transparent carrier.

2. The device according to claim 1, wherein said optically transparent carrier has first contact regions for contact connecting said electronic component to said optoelectronic component, and through said first contact regions said electronic component and said optoelectronic component are electrically connected to said optically transparent carrier.

3. The device according to claim 1, wherein said electronic component and said optoelectronic component are connected to said optically transparent carrier by flip-chip mounting.

4. The device according to claim 1, further comprising an optically transparent potting disposed at least in a region between said optically transparent carrier and an underside of said optoelectronic component and of said electronic component.

5. The device according to claim 1, wherein said frame projects laterally beyond said optically transparent carrier.

6. The device according to claim 1, wherein said frame contains a leadframe.

7. The device according to claim 1, further comprising a nontransparent plastic encapsulating said optically transparent carrier with said electronic component and said optoelectronic component.

8. The device according to claim 1, wherein said optically transparent carrier has markings serving for orienting said optically transparent carrier during mounting.

9. The device according to claim 8, wherein said markings are formed from metallic structures applied on said first surface of said optically transparent carrier and are correspondingly visible through said optically transparent carrier.

10. The device according to claim 1, further comprising optical functional elements for effecting one of light shaping and light deflection of light coupled in or out, said optical functional elements are integrated into said optically transparent carrier.

11. The device according to claim 1, wherein said optoelectronic component is one of a data input and a data output of the device.

12. The device according to claim 11, further comprising a multiplicity of communication channels and said optoelectronic component has, in respect thereof, a multiplicity of optoelectronic transducers.

13. The device according to claim 1, wherein said optoelectronic component is one of at least two optoelectronic components including a first optoelectronic component functioning as data input and a second optoelectronic component functioning as a data output.

14. The device according to claim 13, wherein said at least two optoelectronic components assigned to and connected to said electrical component are formed as an integrated circuit.

15. The device according to claim 1, wherein said optoelectronic component has an array of optoelectronic transducers for converting a multiplicity of optical input signals into electrical input signals for said electronic component and for converting a multiplicity of electrical output signals from said electronic component into optical output signals.

16. The device according to claim 1, wherein said electronic component is selected from the group consisting of a microprocessor, a memory chip and a switch.

17. A device for at least one of optical data transmission, electrical data transmission and data processing, comprising:
   at least one electrical component; at least one optoelectronic component electrically connected to said electrical component;
   an optically transparent carrier having a first surface supporting said electrical component and said optoelectronic component and a second surface, light being coupled into and out of said optoelectronic component through said optically transparent carrier, said optically transparent carrier having first contact regions for contact connecting said electrical component to said optoelectronic component, and through said first contact regions said electrical component and said optoelectronic component being electrically connected to said optically transparent carrier, said optically transparent carrier having second contact regions electrically connected to said first contact regions; and
   a frame connected to said optically transparent carrier, and through said frame said electrical component and said optoelectronic component being electrically contact-connected, said frame having third contact regions electrically contacting said second contact regions of said optically transparent carrier.

18. The device according to claim 17, further comprising conductor tracks disposed on said first surface of said optically transparent carrier, and through said conductor tracks said first contact regions are electrically connected to said second contact regions.

19. The device according to claim 18,
   wherein said frame has fourth electrical contact regions; and
   further comprising further electrical conductor tracks disposed on said frame, said further electrical conductor tracks connect said third contact regions to said fourth electrical contact regions of said frame, said fourth electrical conductor tracks serving for an external electrical contact connection of the device.

20. The device according to claim 19, wherein said fourth electrical contact regions are metallic bumps for electrically connecting the device to a printed circuit board.

21. A device for at least one of optical data transmission, electrical data transmission and data processing, comprising:
   at least one electrical component;
   at least one optoelectronic component electrically connected to said electrical component;
   an optically transparent carrier having a first surface supporting said electrical component and said optoelectronic component and a second surface, light being coupled into and out of said optoelectronic component through said optically transparent carrier, said second surface of said optically transparent carrier is disposed opposite said first surface; and
   a frame connected to said optically transparent carrier, and through said frame said electrical component and said optoelectronic component being electrically contact-connected, said frame is embodied in a stepped manner having a side such that said second surface of said optically transparent carrier lies in a same plane as said side of said frame.

22. A device for at least one of optical data transmission, electrical data transmission and data processing, comprising:
   at least one electrical component;
   at least one optoelectronic component electrically connected to said electrical component;
   an optically transparent carrier having a first surface supporting said electrical component and said optoelectronic component and a second surface, light being coupled into and out of said optoelectronic component through said optically transparent carrier; and
   a frame connected to said optically transparent carrier, and through said frame said electrical component and said optoelectronic component being electrically contact-connected, said frame containing a ceramic part with metallic conductor tracks.

23. A device for at least one of optical data transmission, electrical data transmission and data processing, comprising:
   at least one electrical component;
   at least one optoelectronic component electrically connected to said electrical component;
   an optically transparent carrier having a first surface supporting said electrical component and said optoelectronic component and a second surface, light being coupled into and out of said optoelectronic component through said optically transparent carrier; and
   a frame connected to said optically transparent carrier, and through said frame said electrical component and said optoelectronic component being electrically contact-connected, said frame is a plastic frame with metal contacts encapsulated by injection molding.

24. A device for at least one of optical data transmission, electrical data transmission and data processing, comprising:
   at least one electrical component;
   at least one optoelectronic component electrically connected to said electrical component;
   an optically transparent carrier having a first surface supporting said electrical component and said optoelectronic component and a second surface, light being coupled into and out of said optoelectronic component through said optically transparent carrier, said optically transparent carrier having markings serving for orienting said optically transparent carrier during mounting, said markings are mechanical latching structures disposed on said second surface of said optically transparent carrier, said second surface being disposed opposite to said first surface; and a frame connected to said optically transparent carrier, and through said frame said electrical component and said optoelectronic component being electrically contact-connected.

25. A device for at least one of optical data transmission, electrical data transmission and data processing, comprising:

at least one electrical component;

at least one optoelectronic component electrically connected to said electrical component;

an optically transparent carrier having a first surface supporting said electrical component and said optoelectronic component and a second surface, light being coupled into and out of said optoelectronic component through said optically transparent carrier;

a frame connected to said optically transparent carrier, and through said frame said electrical component and said optoelectronic component being electrically contact-connected; and a metallic covering connected to said frame on said first side of said optically transparent carrier on which said electrical component and said optoelectronic component are disposed.

26. The device according to claim 25, wherein said metallic covering is mechanically connected to at least one of said electrical component and said optoelectronic component for thermal coupling.

27. The device according to claim 25, further comprising at least one electrical contact and said metallic covering is electrically connected to said electrical contact.

28. The device according to claim 25, wherein said metallic covering is part of said frame.

29. A device for at least one of optical data transmission, electrical data transmission and data processing, comprising:

at least one electrical component;

at least two optoelectronic components electrically connected to said electrical component and including a first optoelectronic component functioning as data input and a second optoelectronic component functioning as a data output;

an optically transparent carrier having a first surface supporting said electrical component and said optoelectronic component and a second surface, light being coupled into and out of said optoelectronic component through said optically transparent carrier, said electrical component and said at least two optoelectronic components are disposed in a symmetrical configuration on said optically transparent carrier; and a frame connected to said optically transparent carrier, and through said frame said electrical component and said optoelectronic component being electrically contact connected.

30. The device according to claim 29, wherein said at least two optoelectronic components are optoelectronic transducers each disposed on a side of said electronic component.

31. A device for at least one of optical data transmission, electrical data transmission and data processing, comprising:

at least one electrical component;

at least one optoelectronic component electrically connected to said electrical component;

an optically transparent carrier having a first surface supporting said electrical component and said optoelectronic component and a second surface, light being coupled into and out of said optoelectronic component through said optically transparent carrier, said second surface of said optically transparent carrier is disposed opposite said first surface; and a frame connected to said optically transparent carrier, and through said frame said electrical component and said optoelectronic component being electrically contact-connected, said frame is embodied in a stepped manner having a side such that said second surface of said optically transparent carrier lies in a plane offset to said side of said frame.

* * * * *